March 1, 1966 S. R. ARNOLD ETAL 3,237,271

METHOD OF FABRICATING SEMICONDUCTOR DEVICES

Filed Aug. 7, 1963

INVENTORS S. R. ARNOLD
J. T. NELSON

BY H. W. Lockhart

ATTORNEY

United States Patent Office 3,237,271

Patented Mar. 1, 1966

3,237,271
METHOD OF FABRICATING SEMICONDUCTOR DEVICES

Stephen R. Arnold, Plainfield, and James T. Nelson, Gillette, N.J., assignors to Bell Telephone Laboratories, Incorporated, New York, N.Y., a corporation of New York Filed Aug. 7, 1963, Ser. No. 300,554
2 Claims. (Cl. 29—25.3)

This invention relates to the fabrication of semiconductor devices and, more particularly, to the forming of oxide coatings and metal electrodes on planar transistors.

The technique of using oxide coatings on semiconductor device surfaces has been widely adopted in the art for masking both solid state diffusion and deposition of metal electrodes. In the fabrication of transistors, the diffusion heat treatments and metal deposition steps are often done successively with intermediate etching steps to delineate particular mask patterns. It is advantageous particularly from the standpoint of frequency response to have close spacing between the emitter and base electrodes while at the same time having adequate and complete separation therebetween.

In fulfilling the foregoing requirements for close electrode spacing, very precise registration of the mask patterns subsequently applied for delineating the electrode areas is necessary. This particular step may, in certain devices, call for a disproportionate effort to achieve a satisfactory device. In accordance with this invention, a complete but minimal separation between the emitter and base electrodes is provided by the use of an active, film-forming metal for the base electrode so that the subsequently formed dielectric film on this base electrode provides the desired separation.

Thus a primary object of this invention is to simplify the fabrication of transistors. As a part of this objective, the necessity for precise mask registration is avoided at one critical point in the fabrication process.

Generally, as this invention is applied to a planar transistor, a base region is formed by solid state diffusion from one surface into a limited portion of the semiconductor material using an oxide mask to limit the area of diffusion. A layer of an active film-forming metal such as tantalum then is deposited on the entire surface of the wafer, part of which still is comprised of the oxide mask. Using a superimposed oxide mask, the tantalum then is etched away except for a ring-shaped area generally coincident with and within the diffused base region. The tantalum electrode then is oxidized by heating or, alternatively, anodized to form a thin insulating film on all surfaces thereof. Thereupon an aluminum layer is deposited over the entire surface of the wafer. This aluminum film then is restricted by masking and etching to provide, when alloyed, an emitter region within the center of the oxidized tantalum ring. After removal of the excess aluminum, contact is made to both the alloyed aluminum emitter region and through the tantalum oxide to the underlying tantalum which constitutes the base electrode.

Thus, in the fabrication of the emitter, it is unnecessary to precisely position a deposition mask in order to insure that the emitter will not be electrically connected to the base inasmuch as the film on the base electrode insures electrical isolation. Thus a primary feature of the invention is the use of an active film-forming metal for at least one of the metal electrodes.

The invention and its further objects and features will be better understood from the following detailed description taken in connection with the drawing in which.

Figure 2A:
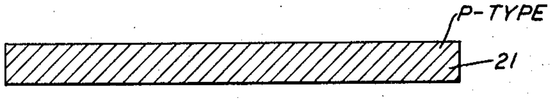
FIGS. 2A through 2F show in schematic cross section the steps of fabrication of the device of FIG. 1.

Referring to the drawing, and particularly to FIG. 2A, there is shown in cross section a wafer 21 of p-type monocrystalline germanium. It will be understood that the fabrication process is usually applied to an entire slice of semiconductor material which then is divided into individual wafers. For ease of description, however, the device will be described in terms of a single wafer.

Figure 2B:
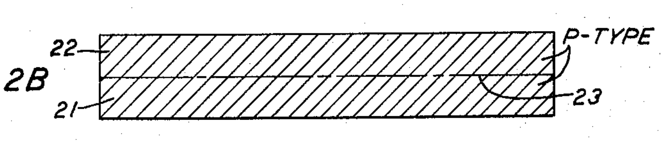

In FIG. 2B, the upper layer 22 represents an epitaxially deposited layer of additional p-type germanium to produce a relatively high resistivity layer 22 demarcated by the boundary 23 with the original material.

Figure 1:
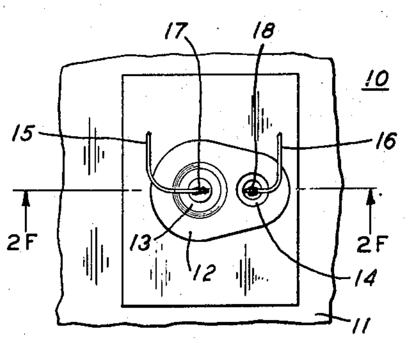
FIG. 1 is a plan view of a transistor element utilizing this invention.
Figure 2C:
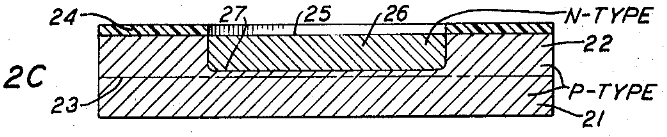
Figure 2D:
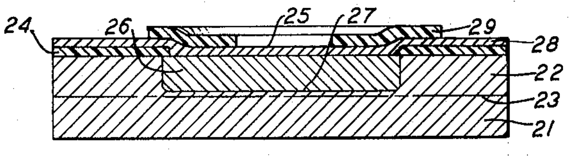

In FIG. 2C, the surface of the layer 22 is masked by the oxide coating 24 of silicon dioxide leaving exposed the portion 25 of the surface which then is subjected to a solid state diffusion heat treatment to produce the n-type diffused region 26 defining a pn junction 27 with the original material. Following these steps, a layer 28 of tantalum metal is deposited over the entire surface of the wafer by well-known sputtering techniques. Portions of this tantalum layer 28 then are removed using a silicon oxide masking layer 29 defined by photoresisting and by etching. This step produces the oval-shaped ohmic electrode 12 as seen in FIG. 1 having a central opening within which the emitter region is to be formed. The deposition of silicon dioxide in the foregoing steps may be done by thermal decomposition techniques well known in the art.

Figure 2E:
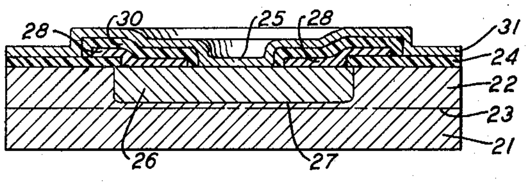
Figure 2F:
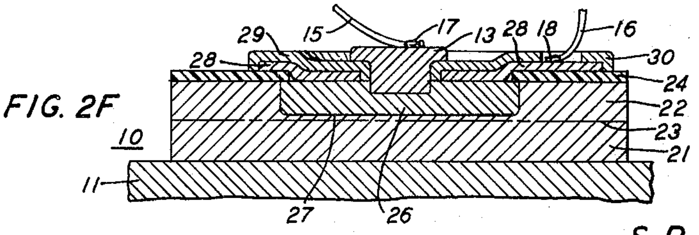

Referring to FIG. 2E, the silicon oxide mask 29 is removed and the element then is heated in an oxidizing atmosphere to produce a tantalum oxide layer 30 over the tantalum electrode 28. This step produces a thin, but complete insulating coating over the tantalum. Advantageously, this film is of from 400 to 2000 angstroms in thickness and serves to completely isolate the tantalum layer 28 which forms the base electrode in ohmic contact with the n-type base region 26. Typically, such a heat treatment is done at a temperature of about 400 degrees centigrade in an oxidizing atmosphere.

Next, a layer of aluminum 31 is deposited over the entire surface so as to be in intimate contact with the central portion of the wafer at the surface 25. All other portions of the aluminum film are deposited on insulating layers, therefore, only the central portion is significant electrically. This element, as shown in FIG. 2*E*, then is heat treated to alloy the central aluminum portion into the semiconductor body to produce the p-type emitter region 13. The area of the aluminum then is defined, by photolithographic techniques, so that a portion of the tantalum oxide over the base contact is exposed for subsequent contacting to the base layer. Also by photoresisting and etching, a small hole 14 is opened in the oxide coating to enable the base lead 16 to be applied to the tantalum electrode using thermocompression bond 18. In a similar fashion, an emitter lead 15 is attached to the alloyed emitter electrode 13 by the thermocompression bonded connection 17. Spacing between the emitter electrode 13 and the base electrode 28 is precisely defined by the thickness of the insulating tantalum oxide layer 30. As a consequence, it is unnecessary to precisely locate a deposition mask to define the position of the aluminum material deposited to make the emitter region. In addition, the emitter electrode 13 can overlap the base electrode 28 and is electrically insulated from it by the tantalum oxide. Hence, larger areas can be provided to facilitate lead bonding with small, active areas for the emitter and base regions of the transistor.

Alternatively, the technique may be used where the emitter region is formed by solid state diffusion rather than by metal deposition and alloying. Where such diffused region is formed, ohmic contact is made thereto, typically, by depositing a suitable metal, such as aluminum, without alloying. In either case, the film on the oxidizable metal provides the precise insulative separation.

Moreover, other oxidizable and anodizable metals may be used. In addition to tantalum, some other useful film-forming metals are titanium, niobium and aluminum. Moreover, other semiconductor materials such as silicon, and the intermetallic compounds may be employed.

Although the invention has been disclosed in terms of a specific embodiment, it will be understood that other variations may be made by those skilled in the art which will be within the spirit and scope of the invention.

What is claimed is:

1. A method of fabricating a planar transistor comprising the steps of depositing on one surface of a semiconductor body a film of silicon oxide, opening a central area of said silicon oxide to expose a portion of said surface, diffusing into said body at said exposed surface a significant impurity of a type opposite to that of the contiguous portion of said body thereby to form a pn junction, depositing on said surface a layer of a metal of the film-forming type, removing portions of said metal layer to expose again a central portion of said surface of said body, forming on said metal layer an insulating film composed of a compound of said metal, depositing over said film and said exposed area of said surface a layer of a metal having significant impurity characteristics opposite to that of said diffused portion, heating said element to alloy said metal into said semiconductor body to form a region of conductivity type opposite to that of said diffused portion.

2. The method of fabricating a planar transistor comprising depositing on one surface of a germanium wafer a layer of silicon oxide, removing a central portion of said oxide to expose an area of said surface, diffusing into said exposed surface a significant impurity of a conductivity type opposite to that of the contiguous region of said geramnium wafer thereby to form a pn junction, depositing on said surface and the oxide layer thereon a layer of tantalum, removing a central portion of said tantalum layer to expose a lesser portion of said central portion, heating said wafer at a temperature of about 400 degrees centigrade in an oxidizing atmosphere thereby to form a film of tantalum oxide on said tantalum layer, diffusing into said exposed lesser portion a significant impurity opposite to the conductivity type of said first diffused portion thereby to form a second pn junction, and depositing on said surface including said lesser exposed portion a layer of aluminum for making ohmic contact to said second diffused region.

No references cited.

RICHARD H. EANES, Jr., *Primary Examiner.*